US007045464B1

(12) United States Patent
Biolsi et al.

(10) Patent No.: US 7,045,464 B1
(45) Date of Patent: May 16, 2006

(54) VIA REACTIVE ION ETCHING PROCESS

(75) Inventors: Peter Biolsi, New Windsor, NY (US); Samuel S. Choi, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/904,533

(22) Filed: Nov. 15, 2004

(51) Int. Cl.
*H01L 21/461* (2006.01)
*H01L 21/302* (2006.01)

(52) U.S. Cl. .................. 438/706; 438/710; 438/723; 438/743; 438/637; 438/638; 438/724; 438/744

(58) Field of Classification Search ................ 438/706, 438/710
See application file for complete search history.

(56) References Cited

U.S. PATENT DOCUMENTS

| | | | | |
|---|---|---|---|---|
| 5,221,424 A | * | 6/1993 | Rhoades ...................... | 216/13 |
| 5,445,710 A | * | 8/1995 | Hori et al. .................. | 438/717 |
| 6,325,861 B1 | * | 12/2001 | Stinnett ......................... | 134/2 |
| 6,376,384 B1 | * | 4/2002 | Yen et al. .................... | 438/706 |
| 6,838,300 B1 | * | 1/2005 | Jin et al. ....................... | 438/38 |
| 6,893,973 B1 | * | 5/2005 | Nishizawa .................. | 438/710 |
| 6,897,159 B1 | * | 5/2005 | Lee et al. .................... | 438/714 |
| 2004/0198062 A1 | * | 10/2004 | Ye et al. ..................... | 438/706 |
| 2005/0059234 A1 | * | 3/2005 | Bera et al. ................... | 438/633 |

OTHER PUBLICATIONS

Armacost, M., et al. "Plasma-etching Processes for ULSI Semiconductor Circuits" IBM Journal of Research and Development, vol. 43, No. 1/2 Jan./Mar. 1999 pp. 39-72.

* cited by examiner

*Primary Examiner*—B. William Baumeister
*Assistant Examiner*—Igwe U. Anya
(74) *Attorney, Agent, or Firm*—James J. Cioffi; Hoffman, Warrick & D'Alessandro, LLC

(57) ABSTRACT

Methods of etching a dielectric layer and a cap layer over a conductor level to open a via to the conductor. The methods include the provision of tetrafluoro methane ($CF_4$) in a photoresist strip. In addition, the methods may provide an increased amount of tetrafluoro methane ($CF_4$) in a dielectric layer etch, and trifluoro methane ($CHF_3$) in a cap layer etch. The invention provides higher yield, more predictable etch rates, faster processing, and removes the need for an ash step.

25 Claims, 3 Drawing Sheets

VIA REACTIVE ION ETCHING PROCESS

TECHNICAL FIELD

The present invention relates generally to semiconductor fabrication, and more particularly, to a via reactive ion etching process.

RELATED ART

In the semiconductor industry, reactive ion etching (RIE) is used to open pathways for circuitry within a semiconductor chip. One structure formed using RIE is a via, which electrically connects conductors within different layers. RIE is a variation of plasma (gas) etching in which a semiconductor wafer is placed on a radio frequency (RF) powered electrode, and etching species are extracted and accelerated from the plasma toward the surface to be etched. A chemical etching reaction occurs which removes parts of the surface. RIE is one of the most common etching techniques in semiconductor manufacturing.

Referring to FIG. 1, a semiconductor structure 10 including large-via pad dielectric layers 12 prior to etching is shown. Structure 10 includes a conductor level 14 including a dielectric layer 16 (e.g., of silicon dioxide $SiO_2$) surrounding conductor 18 (e.g., of copper Cu); a cap layer 20 (e.g., of silicon nitride $Si_3N_4$) atop conductor level 14; a dielectric layer 22 (e.g., of silicon dioxide $SiO_2$); another dielectric layer 24 (e.g., of silicon nitride $Si_3N_4$); and a patterned photoresist 26. A typical large-via RIE process is conducted in a single plasma chamber capable of two RF settings, e.g., 2 MHz and 27 MHz. One conventional RIE process includes the following steps: etching of dielectric layer 24, etching dielectric layer 22 and stopping on cap layer 20 so as to not expose conductor 18, stripping photoresist 26, etching cap layer 20 to expose conductor 18, and finally, performing a nitrogen-hydrogen ($N_2H_2$) plasma chemistry (ash) to remove residual RIE polymers from conductor 18. More specifically, dielectric layer 22 etching may occur, for example, using the following conditions: 80 mTorr (mT) of pressure, an RF energy of 1800 watts (W) at 27 MHz and 600 W at 2 MHz, and a gas flow of 10 standard cubic centimeters per minute (sccm) of tetrafluoro methane ($CF_4$), 220 sccm of carbon monoxide (CO) and 400 sccm of argon (Ar), resulting in an approximately 45 Ångstrom/second (Å/s) etch rate. The photoresist strip may use, for example, the following conditions in two stages including: 800 mT of pressure, an RF energy of 800 W at 27 MHz, and a gas flow of 1000 sccm of oxygen ($O_2$), followed by 450 mT of pressure, 1200 W at 27 MHz and 200 W at 2 MHz, and a gas flow including 1000 sccm of oxygen ($O_2$). The dielectric layer 20 etch may occur, for example, using the following conditions: 150 mT of pressure, an RF energy of 1000 W at 2 MHz and 1500 W at 27 MHz, and a gas flow of 100 sccm of oxygen ($O_2$), 190 sccm tetrafluoro methane ($CF_4$) and 400 sccm argon (Ar). The ash step may occur, for example, using the following conditions: 200 mT of pressure, an RF energy of 1200 W at 27 MHz, and a gas flow including 600 sccm nitrogen ($N_2$) and 200 sccm hydrogen ($H_2$).

The conventional RIE process suffers from a number of problems. First, conventional RIE techniques suffer from a low etch rate because the gas flow for the process is typically centered at the minimum operating range of a mass flow controller, which reduces yields. Second, typical plasma processes are susceptible to gas flow fluctuations, e.g., within a process chamber or between different equipment, which results in widely varying etch rates. Finally, with the movement of wafer fabrication facilities from the conventional 200 mm wafer to the larger 300 mm wafer, process cycle times of conventional RIE processes are considered too long. For example, large via (LV) pads are the final level of 300 mm wafer fabrication connecting the transistors to the wire bonds for the final electrical test. The via RIE process for LV pads typically takes approximately 5 minutes per wafer, which makes this step a target for improvement.

In view of the foregoing, there is a need in the art for an improved via RIE process that does not suffer from the problems of the related art.

SUMMARY OF THE INVENTION

The invention includes methods of etching a dielectric layer and a cap layer over a conductor level to open a via to the conductor. The methods include the provision of tetrafluoro methane ($CF_4$) in a photoresist strip. In addition, the methods may provide an increased amount of tetrafluoro methane ($CF_4$) in a dielectric layer etch, and trifluoro methane ($CHF_3$) in a cap layer etch. The invention provides higher yield, more predictable etch rates, faster processing, and removes the need for an ash step.

A first aspect of the invention is directed to a method of etching a dielectric layer and a cap layer over a conductor level to open a via to the conductor, a pattern for the via being provided by a photoresist, the method comprising the steps of: etching the via through the dielectric layer; stripping the photoresist using a plasma chemistry including tetrafluoro methane ($CF_4$); and etching the cap layer to open the via to the conductor.

A second aspect of the invention includes a method of etching a dielectric layer and a cap layer over a conductor level to open a via to the conductor, a pattern for the via being provided by a photoresist, the method consisting of the steps of: etching the via through the dielectric layer; stripping the photoresist using a plasma chemistry including tetrafluoro methane ($CF_4$); and etching the cap layer to open the via to the conductor.

A third aspect of the invention relates to a method of etching a dielectric layer and a cap layer over a conductor level to open a via to the conductor, a pattern for the via being provided by a photoresist, the method comprising of the steps of: etching the via through the dielectric layer using approximately 80 mT of pressure, an RF energy of approximately 1200 W at 27 MHz and approximately 2700 W at 2 MHz, and a gas flow including tetrafluoro methane ($CF_4$) and carbon monoxide (CO) in a gas flow ratio of no less than approximately 0.104 and no greater than approximately 0.2; stripping the photoresist using a plasma chemistry including tetrafluoro methane ($CF_4$) using a gas flow of no less than approximately 7 standard cubic centimeters per minute (sccm) and no greater than approximately 15 sccm of the tetrafluoro methane ($CF_4$); and etching the cap layer to open the via to the conductor using approximately 150 mT of pressure, an RF energy of approximately 1000 W at 2 MHz and approximately 1500 W at 27 MHz, and a gas flow including tetrafluoro methane ($CF_4$) and trifluoro methane ($CHF_3$) in a gas flow ratio of no less than approximately 2.33 and no greater than approximately 3.96.

A fourth aspect of the invention relates to a method of etching a first dielectric layer, a second dielectric layer and a cap layer over a conductor level to open a via to the conductor, a pattern for the via being provided by a photoresist, the method comprising the steps of: etching the via through the first dielectric layer; etching the via through the second dielectric layer; stripping the photoresist using a plasma chemistry including tetrafluoro methane ($CF_4$); and etching the cap layer to open the via to the conductor.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Figure 1:
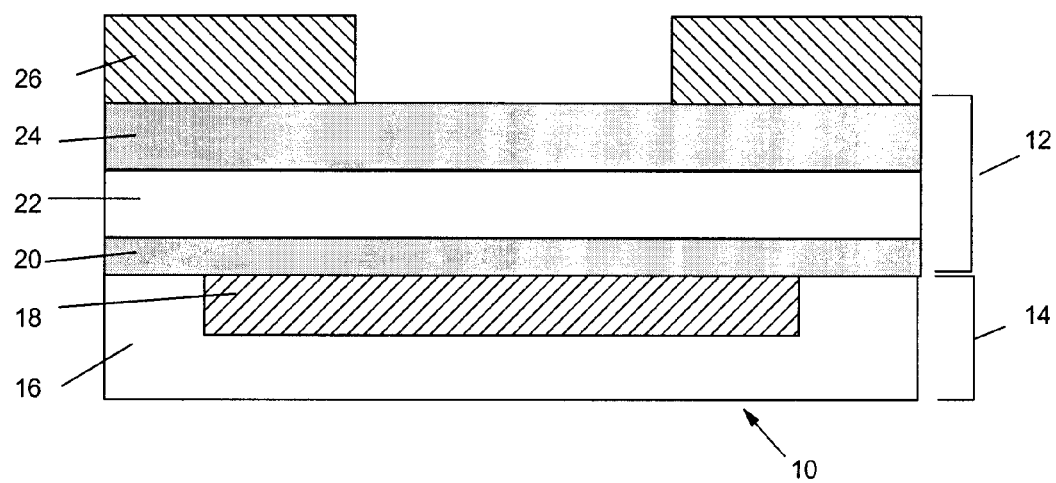
FIG. 1 shows a conventional semiconductor structure including large-via pad dielectric layers prior to etching.

With reference to the accompanying drawings, FIGS. 2–5 show a method of etching a dielectric layer and a cap layer over a conductor level to open a via to the conductor according to the invention. The method modifies the conventional process such that the process results in improved yields, more predictable etch rates and greatly reduced processing time. The process begins with a conventional semiconductor structure 10 including large-via pad dielectric layers 12, similar to that shown in FIG. 1. Structure 10 includes a conductor level 14 including a dielectric layer 16 (e.g., of silicon dioxide $SiO_2$ or any other appropriate dielectric material) surrounding conductor 18 (e.g., of copper Cu); a cap layer 20 atop conductor level 14; a dielectric layer 22; another dielectric layer 24 (e.g., of silicon nitride $Si_3N_4$ or any other dielectric material); and a patterned photoresist 26. Patterned photoresist 26 includes a pattern (opening) for the via to be formed. Dielectric layer 22 may include any silicon dioxide ($SiO_2$) type material such as hydrogenated silicon oxycarbide (SiCOH), CORAL™ available from Novellus, tetraethyl orthosilicate (Si($OC_2H_5)_4$)(TEOS), fluorine doped TEOS (FTEOS), fluorine doped silicate glass (FSG), undoped silicate glass (USG), boro-phospho-silicate glass (BPSG), etc. Cap layer 20 may include any typical cap material such as: high density plasma (HDP) silicon nitride, ultraviolet light transparent silicon nitride (UVN), silicon carbide (SiC), etc.

Figure 2:
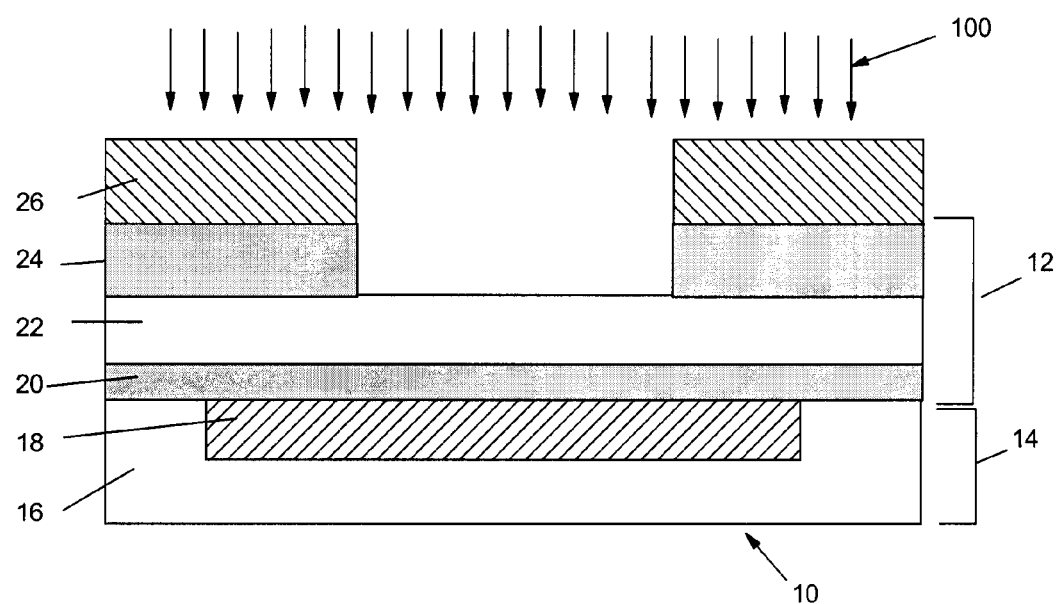
FIGS. 2–5 show a method of etching a via according to the invention.

An initial step of the method includes, as shown in FIG. 2, etching through dielectric (e.g., silicon nitride) layer 24. Since the etch conditions 100 used may be any conventional method, this step is not considered an integral part of the invention in all cases.

Figure 3:
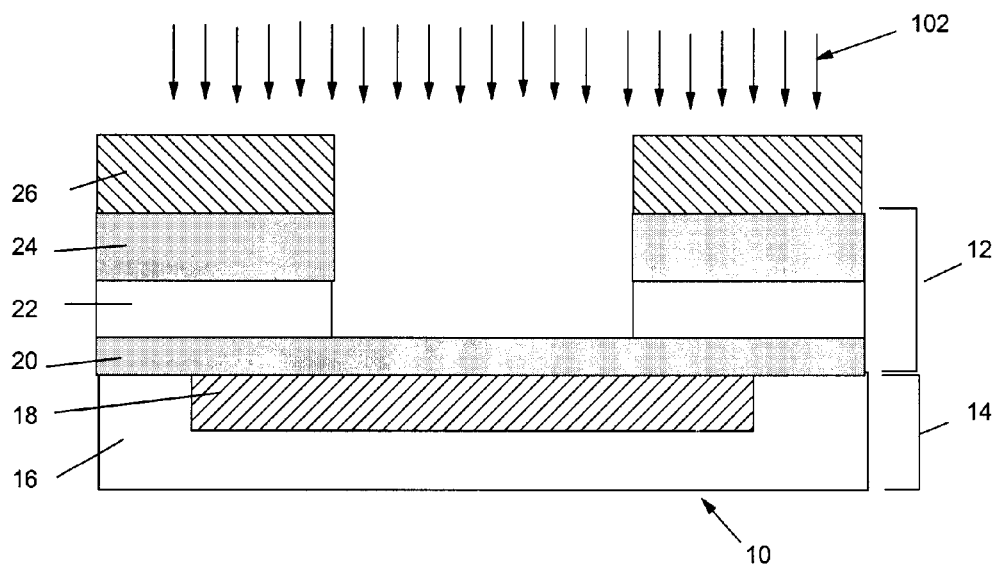

Next, as shown in FIG. 3, the via is etched through dielectric layer 22. In one embodiment, etching recipe 104 includes using approximately 80 mTorr (mT) of pressure, and an RF energy of approximately 1200 watts (W) at 27 MHz and approximately 2700 W at 2 MHz, which represents an increase in RF energy compared to the conventional process. A gas flow for this embodiment includes tetrafluoro methane ($CF_4$) and carbon monoxide (CO) in a gas flow ratio of approximately 0.104–0.200, and preferably about 0.136. Tetrafluoro methane ($CF_4$) (also known as carbon tetrafluoride) is an etchant that etches practically all dielectrics, and is available, for example, under the brand name Freon® 14 from Dupont. In one embodiment, the gas flow includes approximately 25–40 sccm of tetrafluoro methane ($CF_4$) (preferably about 30 sccm), and approximately 200–240 sccm of carbon monoxide (CO) (preferably about 220 sccm). In addition, the gas flow includes approximately 400 sccm of argon (Ar). This etch recipe 102 provides more than twice as fast an etch rate (i.e., approximately 95 Ångstroms/second (Å/s)) as the conventional process due to an increased amount of tetrafluoro methane ($CF_4$). In addition, this etch recipe 102 is highly selective to cap layer 20, and causes no changes in the etch profile compared to the conventional process.

Figure 4:
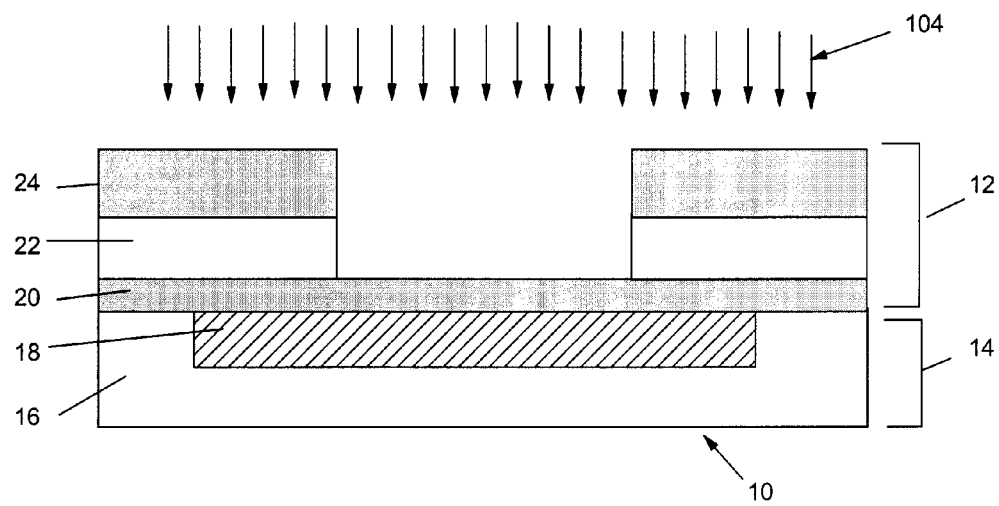

Referring to FIG. 4, a next step includes stripping the photoresist using a plasma chemistry 102 including tetrafluoro methane ($CF_4$), which is not used in conventional stripping processes. In one embodiment, the photoresist stripping step includes two stages. A first stage uses approximately 120 mT of pressure, and an RF energy of approximately 1000 W at 27 MHz and approximately 200 W at 2 MHz. In one embodiment, a gas flow of approximately 900–1100 sccm of oxygen ($O_2$) (preferably about 1000 sccm) is used in the first stage. A second stage uses approximately 400 mT of pressure, and an RF energy of approximately 1600 W at 2 MHz. A gas flow of the second stage includes tetrafluoro methane ($CF_4$) and oxygen ($O_2$) in a gas flow ratio of approximately 0.006–0.016, and preferably about 0.010. During the second stage, the tetrafluoro methane ($CF_4$) may be provided at approximately 7–15 sccm (preferably about 10 sccm), and the oxygen ($O_2$) may be provided at approximately 900–1100 sccm (preferably about 1000 sccm).

Figure 6:
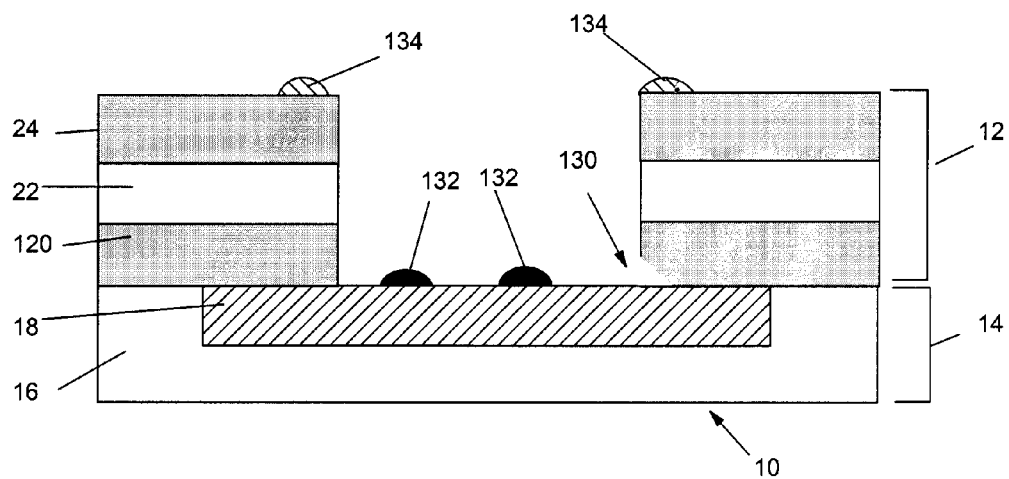
FIG. 6 shows a semiconductor structure illustrating some of the problems solved by the invention.

The photoresist strip step according to the invention adds tetrafluoro methane ($CF_4$) gas to remove photoresist polymer 134 (FIG. 6) left behind from the high RF energy used during the dielectric etching 100 (FIG. 3). Contrary to expectations, however, the addition of tetrafluoro methane ($CF_4$) does not etch cap layer 20 sufficiently to cause exposure of conductor 18, and does not affect the etch profile. In particular, a low gas flow and duration provides enough tetrafluoro methane ($CF_4$) to obtain a clean strip of the hardened photoresist polymer 134 (FIG. 6) while minimizing the etching of cap layer 20. More significantly, however, the addition of tetrafluoro methane ($CF_4$) cuts the etching time in approximately half compared to the conventional process, which greatly increases the overall speed of the via RIE process. In particular, this stage may last approximately 10–15 seconds, which is significantly shorter than the conventional process, which typically lasts 20–30 seconds. Another advantage of the tetrafluoro methane ($CF_4$) usage is that it removes residual polymer created by the oxygen ($O_2$) etch (FIG. 3), and leaves a clean cap layer 20 surface after photoresist strip. As shown in FIG. 6, the oxygen ($O_2$) etch with such a high RF energy tends leave photoresist 26 (FIG. 3) harder than in conventional RIE processes, which causes increased residual photoresist polymer 134, e.g., carbon mixed with oxide. However, the tetrafluoro methane ($CF_4$) removes this residual polymer.

Figure 5:
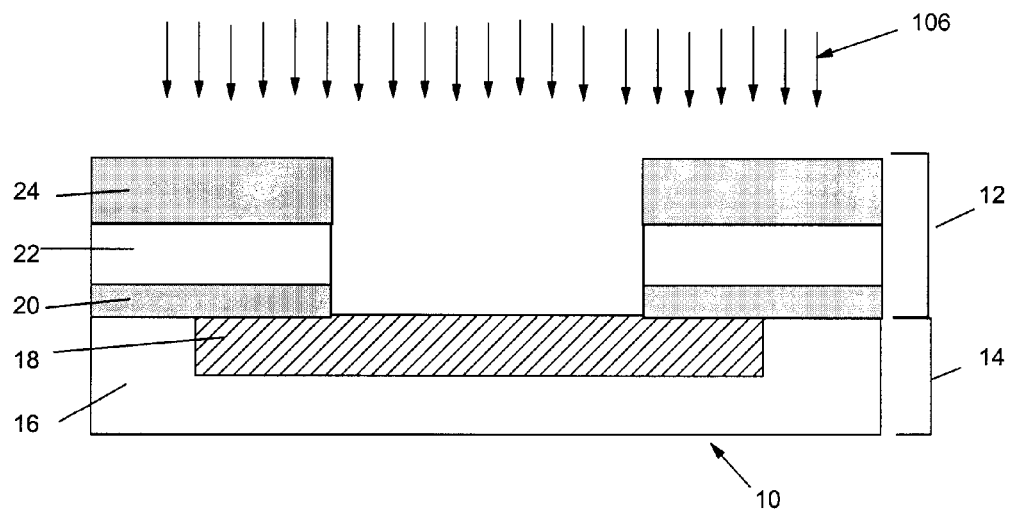

Referring to FIG. 5, the next step includes etching cap layer 20 to open the via to conductor 18. In one embodiment, the cap layer etching step includes an etch recipe 106 using approximately 150 mT of pressure, and an RF energy of approximately 1000 W at 2 MHz and approximately 1500 W at 27 MHz. A gas flow includes tetrafluoro methane ($CF_4$) and trifluoro methane ($CHF_3$) in a gas flow ratio of approximately 2.33–3.96. Trifluoro methane ($CHF_3$) (also known as fluoroform) is available, for example, under trade name Freon® 23 from Dupont. The addition of trifluoro methane ($CHF_3$) is presented in this step to improve sidewall profile striations, which would lead to higher contact resistance. In one embodiment, the gas flow includes approximately 80–110 sccm of oxygen ($O_2$) (preferably about 100 sccm), approximately 170–210 sccm of the tetrafluoro methane ($CF_4$) (preferably about 190 sccm), and approximately 53–73 sccm of the trifluoro methane ($CHF_3$) (preferably about 63 sccm). The gas flow also includes approximately 400 sccm of argon (Ar).

With further regard to the cap layer etching step, for certain types of vias, the thickness of cap layer 20 may be thicker than in other via pad dielectric stacks. For instance, the above values are optimal for a cap layer 20 having a thickness of approximately 800–1200 Å, i.e., about 1000 Å, of, for example, silicon nitride. However, thicker cap layers 120 of, for example, silicon nitride, such as shown in FIG. 6, are subject to undercutting 130 and metal oxidation 132 that lead to higher contact resistance when the above-described amount of oxygen ($O_2$) is used. To address this situation, in an alternative embodiment, the gas flow includes the same gases and rates as described above, except the amount of oxygen ($O_2$) is reduced by a factor of approximately 10, which prevents the undercutting. In one embodiment, the amount of oxygen is approximately 7–13 sccm, and is preferably about 10 sccm. This amount of oxygen ($O_2$) has been found sufficient for cap layers 120 (FIG. 6) having a thickness of approximately 2500–3500 Å, i.e., about 3000 Å, of, for example, silicon nitride. In particular, the given oxygen gas flow results in no lateral undercut 130 (FIG. 6), minimal metal oxidation 134 (FIG. 6), and does not compromise etching time. Further decrease in oxygen gas, however, results in a dramatic drop in etch rate.

The above-described method also reduces processing time by eliminating the need for a nitrogen-hydrogen plasma chemistry (ash) step as in conventional via RIE processing. This saves approximately 45 seconds per wafer. The invention also attains required wall profile angle, provides high selectivity of dielectric layer 22 etching chemistry 104 to cap layer 20, and minimal oxidation of a surface of metal 18. The invention can be applied to any large via pads requiring high etching selectivity to a cap layer 20, minimal cap layer 20 undercutting, and reduced metal oxidation. The invention provides higher yield, more predictable etch rates, and faster processing, and removes the need for an ash step.

The following table summarizes the RIE etch parameters for a preferred embodiment:

| | Dielectric Layer 22 | Photoresist Stage 1 | Photoresist Stage 2 | Cap Layer 20 (~1000Å) | Cap Layer 120 (~3000Å) |
|---|---|---|---|---|---|
| Pressure (mT) | 80 | 120 | 400 | 150 | 150 |
| RF energy (W) | | | | | |
| 27 MHz | 1200 | 1000 | 0 | 1500 | 1500 |
| 2 MHz | 2700 | 200 | 1600 | 1000 | 1000 |
| Gas Flow (sccm) | | | | | |
| $CH_4$ | 25–40 | 0 | 0 | 7–15 | 170–210 | 170–210 |
| $CHF_3$ | 0 | 0 | 0 | 53–73 | 53–73 |
| CO | 200–240 | 0 | 0 | 0 | 0 |
| $O_2$ | 0 | 900–1100 | 900–1100 | 80–110 | 7–13 |
| Ar | 400 | 0 | 0 | 400 | 400 |

-continued

| | Dielectric Layer 22 | Photoresist Stage 1 | Photoresist Stage 2 | Cap Layer 20 (~1000Å) | Cap Layer 120 (~3000Å) |
|---|---|---|---|---|---|
| Gas Flow Ratios: | | | | | |
| $CF_4/CO$ | 0.104–0.200 | — | — | — | — |
| $CF_4/O_2$ | — | — | 0.006–0.0160 | — | — |
| $CF_4/CHF_3$ | — | — | — | 2.33–3.96 | 2.33–3.96 |

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of etching a dielectric layer and a cap layer over a conductor level to open a via to a conductor, a pattern for the via being provided by a photoresist, the method comprising the steps of:
    etching the via through the dielectric layer;
    stripping the photoresist using a plasma chemistry including tetrafluoro methane ($CF_4$); and
    etching the cap layer to open the via to the conductor;
    wherein the dielectric layer etching step includes using approximately 80 mT of pressure, an RF energy of approximately 1200 W at 27 MHz and approximately 2700 W at 2 MHz, and a gas flow including tetrafluoro methane ($CF_4$) and carbon monoxide (CO) in a gas flow ratio of no less than approximately 0.104 and no greater than approximately 0.2.

2. The method of claim 1, wherein the gas flow during the dielectric layer etching step includes no less than approximately 25 and no greater than approximately 40 standard cubic centimeters per minute (sccm) of tetrafluoro methane ($CF_4$), no less than approximately 200 and no greater than approximately 240 sccm of carbon monoxide (CO), and approximately 400 sccm of argon (Ar).

3. The method of claim 1, wherein the dielectric layer etching step has an etch rate of approximately 95 Ångstroms/second (Å/s).

4. The method of claim 1, wherein the photoresist stripping step includes using a gas flow of no less than approximately 7 standard cubic centimeters per minute (sccm) and no greater than approximately 15 sccm of the tetrafluoro methane ($CF_4$).

5. A method of etching a dielectric layer and a cap layer over a conductor level to open a via to a conductor, a pattern for the via being provided by a photoresist, the method comprising the steps of:
    etching the via through the dielectric layer;
    stripping the photoresist using a plasma chemistry including tetrafluoro methane ($CF_4$); and
    etching the cap layer to open the via to die conductor;
    wherein the photoresist stripping step includes two stages including:
    a first stage using approximately 120 mT of pressure, an RF energy of approximately 1000 W at 27 MHz and approximately 200 W at 2 MHz, and a gas flow including oxygen ($O_2$); and a second stage using approximately 400 mT of pressure, an RF energy of approximately 1600 W at 2 MHz, and a gas flow including the tetrafluoro methane ($CF_4$) and oxygen ($O_2$) in a gas flow ratio no less than approximately 0.006 and no greater than, approximately 0.016.

6. The method of claim 5, wherein the gas flow of the first stage includes no less than approximately 900 standard cubic centimeters per minute (sccm) and no greater than approximately 1100 sccm of the oxygen $O_2$.

7. The method of claim 5, wherein the gas flow of the second stage includes no less than approximately 7 standard cubic centimeters per minute (sccm) and no greater than approximately 15 sccm of the tetrafluoro methane ($CF_4$), and no less than approximately 900 sccm and no greater than approximately 1100 sccm of the oxygen ($O_2$).

8. The method of claim 5, wherein the cap layer etching step includes using approximately 150 mT of pressure, an RF energy of approximately 1000 W at 2 MHz and approximately 1500 W at 27 MHz, and a gas flow including tetrafluoro methane ($CF_4$) and trifluoro methane ($CHF_3$) in a gas flow ratio of no less than approximately 2.33 and no greater than approximately 3.96.

9. The method of claim 8, wherein, in the case that the cap layer has a thickness of no less than approximately 800 Å and no greater than 1200 Å, the cap layer etching step gas flow includes no less than approximately 80 and no greater than approximately 110 standard cubic centimeters per minute (sccm) of oxygen ($O_2$), no less than approximately 170 and no greater than approximately 210 sccm of tetrafluoro methane ($CF_4$), no less than approximately 53 and no greater than approximately 73 sccm of trifluoro methane ($CHF_3$), and approximately 400 sccm of argon (Ar).

10. The method of claim 8, wherein, in the case that the cap layer has a thickness of no less than approximately 2500 Å and no greater than 3500 Å, the cap layer etching step gas flow includes no less than approximately 7 and no greater than approximately 13 standard cubic centimeters per minute (sccm) of oxygen ($O_2$), no less than approximately 170 and no greater than approximately 210 seem of tetrafluoro methane ($CF_4$), no less than approximately 53 and no greater than approximately 73 sccm of trifluoro methane ($CHF_3$), and approximately 400 sccm of argon (Ar).

11. A method of etching a dielectric layer and a cap layer over a conductor level to open a via to a conductor, a pattern for the via being provided by a photoresist the method consisting of the steps of:
 etching the via through the dielectric layer;
 stripping the photoresist using a plasma chemistry including tetrafluoro methane ($CF_4$); and
 etching the cap layer to open the via to the conductor;
 wherein the dielectric layer etching step includes using approximately 80 mT of pressure, an RF energy of approximately 1200 W at 27 MHz and approximately 2700 W at 2 MHz, and a gas flow including tetrafluoro methane ($CF_4$) and carbon monoxide (CO) in a gas flow ratio of no less than approximately 0.104 and no greater than approximately 0.2.

12. The method of claim 11, wherein the gas flow during the dielectric layer etching step includes no less than approximately 25 and no greater than approximately 40 standard cubic centimeters per minute (sccm) of tetrafluoro methane ($CF_4$), no less than approximately 200 and no greater than approximately 240 sccm of carbon monoxide (CO), and approximately 400 sccm of argon (Ar).

13. The method of claim 11, wherein the photoresist stripping step includes using a gas flow of no less than approximately 7 standard cubic centimeters per minute (sccm) and no greater than approximately 15 sccm of the tetrafluoro methane ($CF_4$).

14. The method of claim 11, wherein the photoresist stripping step includes two stages including:
 a first stage using approximately 120 mT of pressure, an RE energy of approximately 1000 W at 27 MHz and approximately 200 W at 2 MHz, and a gas flow including oxygen ($O_2$); and
 a second stage using approximately 400 mT of pressure, an RF energy of approximately 1600 W at 2 MHz, and a gas flow including the tetrafluoro methane ($CF_4$) and oxygen ($O_2$) in a gas flow ratio no less than approximately 0.006 and no greater than approximately 0.016.

15. The method of claim 14, wherein the gas flow of the first stage includes no less than approximately 900 standard cubic centimeters per minute (sccm) and no greater than approximately 1100 sccm of the oxygen ($O_2$).

16. The method of claim 14, wherein the gas flow of the second stage includes no less than approximately 7 sccm and no greater than approximately 15 sccm of the tetrafluoro methane ($CF_4$), and no less than approximately 900 sccm and no greater than approximately 1100 sccm of the oxygen ($O_2$).

17. The method of claim 11, wherein the cap layer etching step includes using approximately 150 mT of pressure, an RF energy of approximately 1000 W at 2 MHz and approximately 1500 W at 27 MHz, and a gas flow including tetrafluoro methane ($CF_4$) and trifluoro methane ($CHF_3$) in a gas flow ratio of no less than approximately 2.33 and no greater than approximately 3.96.

18. The method of claim 17, wherein, in the case that the cap layer has a thickness of no less than approximately 800 Å and no greater than 1200 Å, the cap layer etching step gas flow includes no less than approximately 80 and no greater than approximately 110 standard cubic centimeters per minute (sccm) of oxygen ($O_2$), no less than approximately 170 and no greater than approximately 210 sccm of tetrafluoro methane ($CF_4$), no less than approximately 53 and no greater than approximately 73 sccm of trifluoro methane ($CHF_3$), and approximately 400 sccm of argon (Ar).

19. The method of claim 17, wherein, in the case that the cap layer has a thickness of no less than approximately 2500 Å and no greater than 3500 Å, the cap layer etching step gas flow includes no less than approximately 7 and no greater than approximately 13 standard cubic centimeters per minute (sccm) of oxygen ($O_2$), no less than approximately 170 and no greater than approximately 210 sccm of tetrafluoro methane ($CF_4$), no less than approximately 53 and no greater than approximately 73 sccm of trifluoro methane ($CHF_3$), and approximately 400 sccm of argon (Ar).

20. A method of etching a dielectric layer and a cap layer over a conductor level to open a via to a conductor, a pattern for the via being provided by a photoresist, the method comprising of the steps of:
 etching the via through the dielectric layer using approximately 80 mT of pressure, an RF energy of approximately 1200 W at 27 MHz and approximately 2700 W at 2 MHz, and a gas flow including tetrafluoro methane ($CF_4$) and carbon monoxide (CO) in a gas flow ratio of no less than approximately 0.104 and no greater than approximately 0.2;
 stripping the photoresist using a plasma chemistry including tetrafluoro methane ($CF_4$) using a gas flow of no less than approximately 7 standard cubic centimeters per minute (sccm) and no greater than approximately 15 sccm of the tetrafluoro methane ($CF_4$); and etching the cap layer to open the via to the conductor using approximately 150 mT of pressure, an RF energy of approximately 1000 W at 2 MHz and approximately 1500 W at 27 MHz, and a gas flow including tetrafluoro methane ($CF_4$) and trifluoro methane ($CHF_3$) in a gas flow ratio of no less than approximately 2.33 and no greater than approximately 3.96.

21. The method of claim 20, wherein the gas flow the dielectric layer etching step includes no less than approximately 25 and no greater than approximately 40 standard cubic centimeters per minute (sccm) of tetrafluoro methane ($CF_4$), no less than approximately 200 and no greater than approximately 240 sccm of carbon monoxide (CO), and approximately 400 sccm of argon (Ar).

22. The method of claim 20, wherein die photoresist stripping step includes two stages including:
   a first stage using approximately 120 mT of pressure, an RF energy of approximately 1000 W at 27 MHz and approximately 200 W at 2 MHz, and a gas flow of no less than approximately 900 standard cubic centimeters per minute (sccm) and no greater than approximately 1100 seem of oxygen ($O_2$); and
   a second stage using approximately 400 mT of pressure, an RF energy of approximately 1600 W at 2 MHz, and a gas flow including the tetrafluoro methane ($CF_4$) and oxygen ($O_2$) in a gas flow ratio no less than approximately 0.006 and no greater than approximately 0.016.

23. The method of claim 22, wherein the gas flow of the second stage includes no less than approximately 900 sccm and no greater than approximately 1100 sccm of the oxygen ($O_2$).

24. The method of claim 20, wherein, in the case that the cap layer has a thickness of no less than approximately 800 Å and no greater than 1200 Å, the cap layer etching step gas flow includes no less than approximately 80 and no greater than approximately 110 standard cubic centimeters per minute (sccm) of oxygen ($O_2$), no less than approximately 170 and no greater than approximately 210 sccm of tetrafluoro methane ($CF_4$), no less than approximately 53 and no greater than approximately 73 sccm of trifluoro methane ($CHF_3$), and approximately 400 sccm of argon (Ar).

25. The method of claim 20, wherein, in the case that the cap layer has a thickness of no less than approximately 2500 Å and no greater than 3500 Å, the cap layer etching step gas flow includes no less than approximately 7 and no greater than approximately 13 standard cubic centimeters per minute (sccm) of oxygen ($O_2$), no less than approximately 170 and no greater than approximately 210 sccm of tetrafluoro methane ($CF_4$), no less than approximately 53 and no greater than approximately 73 sccm of trifluoro methane ($CHF_3$), and approximately 400 sccm of argon (Ar).

* * * * *

UNITED STATES PATENT AND TRADEMARK OFFICE
CERTIFICATE OF CORRECTION

| | |
|---|---|
| PATENT NO. | : 7,045,464 B1 |
| APPLICATION NO. | : 10/904533 |
| DATED | : May 16, 2006 |
| INVENTOR(S) | : Biolsi et al. |

It is certified that error appears in the above-identified patent and that said Letters Patent is hereby corrected as shown below:

Column 6, Line 61, Please Remove " die " and insert -- the --.
Column 9, Line 15, Please Remove " die " and insert -- the --.

Signed and Sealed this

Fifteenth Day of August, 2006

JON W. DUDAS
*Director of the United States Patent and Trademark Office*